United States Patent
Sukegawa et al.

(10) Patent No.: US 7,351,068 B2
(45) Date of Patent: Apr. 1, 2008

(54) SEMICONDUCTOR DEVICE

(75) Inventors: Shunichi Sukegawa, Ibaraki (JP);
Kenichi Shigenami, Kanagawa (JP);
Mamoru Kudo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/627,527

(22) Filed: Jan. 26, 2007

(65) Prior Publication Data
US 2007/0184677 A1 Aug. 9, 2007

(30) Foreign Application Priority Data
Feb. 8, 2006 (JP) .............................. 2006-031271

(51) Int. Cl.
*H01R 12/00* (2006.01)

(52) U.S. Cl. ........................................................ 439/66

(58) Field of Classification Search .................. 439/66, 439/71, 73; 324/762, 754, 763, 158.1; 361/734, 361/77, 720, 810; 174/255–257
See application file for complete search history.

(56) References Cited

U.S. PATENT DOCUMENTS

| 7,173,442 | B2 * | 2/2007 | Treibergs et al. ............ 324/762 |
| 7,182,606 | B2 * | 2/2007 | Ishii et al. ..................... 439/66 |
| 7,214,887 | B2 * | 5/2007 | Higashida et al. ........... 174/260 |
| 7,248,036 | B2 * | 7/2007 | Trobough et al. ......... 324/158.1 |

* cited by examiner

*Primary Examiner*—J. F. Duverne
(74) *Attorney, Agent, or Firm*—Oblon, Spivak, McClelland, Maier & Neustadt, P.C.

(57) ABSTRACT

A semiconductor device includes a first plate member having a circuit surface on which a circuit is provided, a second plate member having a circuit surface on which a circuit is provided, a plurality of first flat plates disposed on the circuit surface of the first plate member, a first communicating section disposed on the circuit surface of the first plate member, a plurality of second flat plates disposed on the circuit surface of the second plate member, and a second communicating section disposed on the circuit surface of the second plate member. The first plate member and the second plate member are arranged so that a surface of the first plate member opposite to the circuit surface faces a surface of the second plate member opposite to the circuit surface.

4 Claims, 14 Drawing Sheets

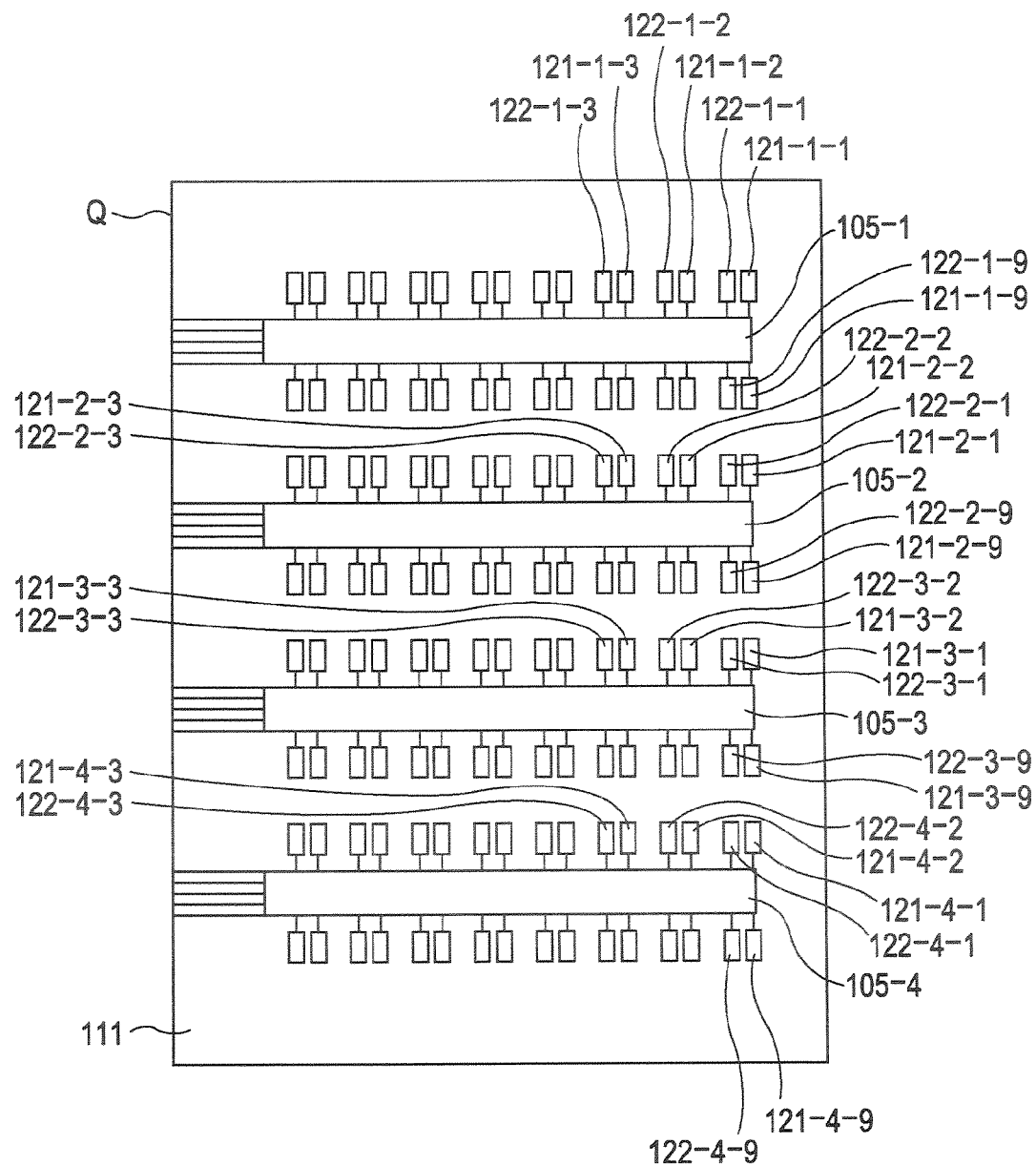

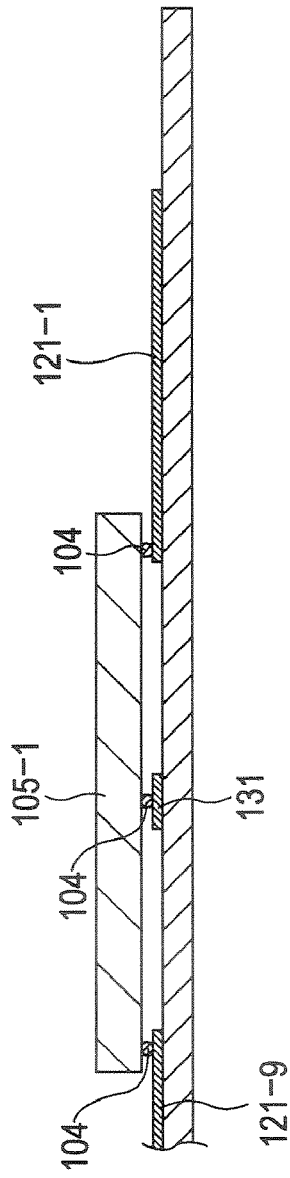
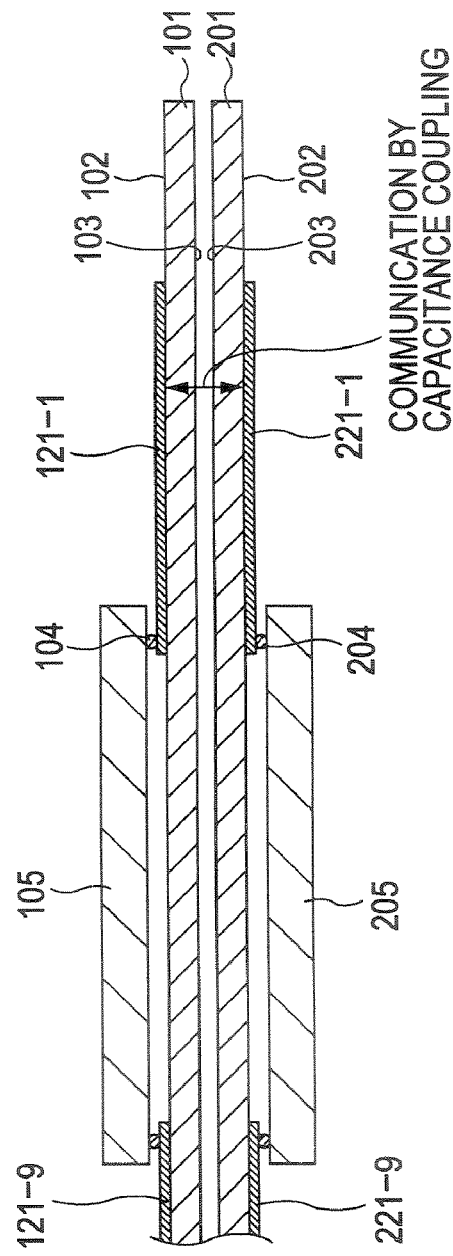

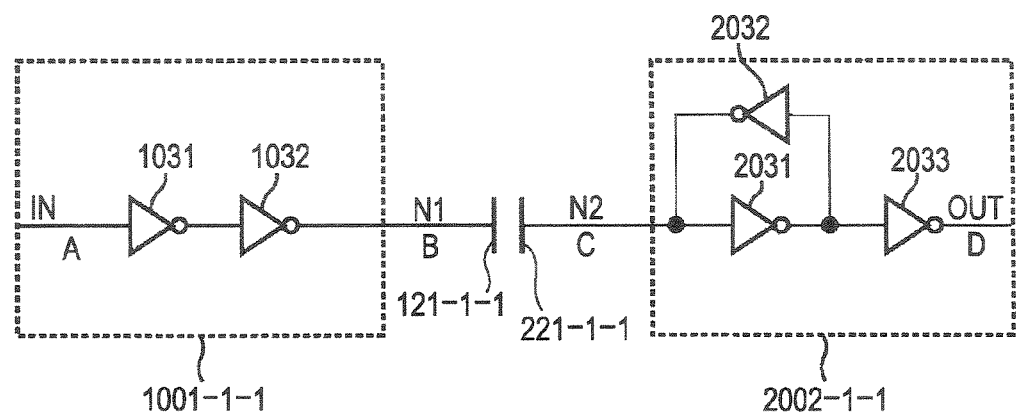
FIG. 12
FIG. 13A  IN [V] 
FIG. 13B  N1 [V] 
FIG. 13C  N2 [V]  Vth
FIG. 13D  OUT [V] 

SEMICONDUCTOR DEVICE

CROSS REFERENCES TO RELATED APPLICATIONS

The present invention contains subject matter related to Japanese Patent Application JP 2006-031271 filed in the Japanese Patent Office on Feb. 8, 2006, the entire contents of which are incorporated herein by reference.

BACKGROUND OF THE INVENTION

1. Field of the Invention

The present invention relates to semiconductor devices, and more particularly, to a semiconductor device that can be easily produced at low cost and that can achieve communication with low power consumption.

2. Description of the Related Art

With the popularization of electronic devices, a layering technique and a chip wiring technique have been proposed which allow a multichip package or a system-in package (SIP) including stacked multichip modules (MCMs) to be obtained at low cost.

FIG. 1 shows an example of a configuration of a known multichip module. In this multichip module, a silicon interposer 1 and a silicon interposer 21 are combined with each other. Chips 5 are mounted on a first surface 2 of the silicon interposer 1 with bumps 4 disposed therebetween, and similarly, chips 25 are mounted on a first surface 22 of the silicon interposer 21 with bumps 24 disposed therebetween. Through holes 6 are provided between the first surface 2 and a second surface 3 of the silicon interposer 1, and through holes 26 are provided between the first surface 22 and a second surface 23 of the silicon interposer 21. The through holes 6 and the through holes 26 are connected by bumps 7. Communication between the chips 5 on the silicon interposer 1 and the chips 25 on the silicon interposer 21 is conducted via a pattern provided on the silicon interposer 1, the through holes 6 of the silicon interposer 1, the bumps 7, the through holes 26 of the silicon interposer 21, and a pattern provided on the silicon interposer 21.

However, when the through holes are formed, it is necessary to add a new process and to form electrodes on the second surfaces of the silicon interposers. Moreover, it is difficult to form fine through holes.

Accordingly, *Nikkei Electronics*, Oct. 10, 2005, pp. 92-99 discloses communication utilizing capacitance coupling, as shown in FIG. 2A. In FIG. 2A, an electrode 41 is provided on a first surface 2 (a surface on which chips 5 are mounted) of a silicon interposer 1, and similarly, an electrode 51 is provided on a first surface (a surface on which chips 25 are mounted) of an interposer 21. The first surface 2 of the silicon interposer 1 and the first surface 22 of the silicon interposer 21 are aligned so that the electrode 41 and the electrode 51 face each other. Communication between the chips 5 on the first surface 2 of the silicon interposer 1 and the chips 25 on the first surface 22 of the silicon interposer 21 is conducted by using electrostatic induction between the electrodes 41 and 51.

SUMMARY OF THE INVENTION

However, for example, it is better, in terms of cost and productivity, to conduct communication via bumps 61 provided between the first surface 2 of the silicon interposer 1 and the first surface 22 of the silicon interposer 21, as shown in FIG. 2B, than to conduct wireless communication with the electrodes 41 and 51 facing each other, as shown in FIG. 2A.

It is desirable to provide a semiconductor device that can be easily produced at low cost and that allows communication with lower power consumption.

A semiconductor device according to an embodiment of the present invention includes a first plate member formed of a high-resistance material, and having a circuit surface on which a circuit is provided; a second plate member formed of a high-resistance material, and having a circuit surface on which a circuit is provided; a plurality of first flat plates serving as communication antennas, the first flat plates being disposed on the circuit surface of the first plate member; a first communicating section for performing communication via the first flat plates, the first communicating section being disposed on the circuit surface of the first plate member; a plurality of second flat plates serving as communication antennas, the second flat plates being disposed on the circuit surface of the second plate member; and a second communicating section for performing communication via the second flat plates, the second communicating section being disposed on the circuit surface of the second plate member. The first plate member and the second plate member are arranged so that a surface of the first plate member opposite to the circuit surface faces a surface of the second plate member opposite to the circuit surface.

Preferably, the first plate member has a bonding wire for receiving power, and the second plate member has a bump for receiving power.

Preferably, the first plate member and the second plate member are silicon interposers, and have a volume resistivity of 1 kΩcm or more.

Preferably the first plate member and the second plate member include at least two pairs of the first plate members and the second plate members, the circuit surface of one of the first plate member and the second plate member in one of the pairs faces the circuit surface of one of the first plate member and the second plate member in the other pair, and a communication bump and a power supply bump are provided between the circuit surfaces.

According to the embodiment of the present invention, the first plate member includes a plurality of first flat plates serving as communication antennas and disposed on the circuit surface on which a circuit is provided, and the second plate member includes a plurality of second flat plates serving as communication antennas and disposed on the circuit surface on which a circuit is provided. The first plate member and the second plate member are arranged so that a surface of the first plate member opposite to the circuit surface faces a surface of the second plate member opposite to the circuit surface. Communication between the first communicating section of the first plate member and the second communicating section of the second plate member is performed by utilizing electrostatic induction between the first flat plates and the second flat plates while the first plate member and the second plate member are interposed between the first and second flat plates.

As described above, the embodiment of the present invention can provide a semiconductor device. More particularly, the embodiment of the present invention can provide a semiconductor device that can be easily produced at low cost and that allows communication with low power consumption.

BRIEF DESCRIPTION OF THE DRAWINGS

FIG. 6 is a plan view showing communication chips and their surroundings;

FIG. 7 is a sectional side view showing the communication chip and its surroundings;

FIG. 8 is a sectional side view showing a state in which the silicon interposers are combined;

FIG. 12 is a circuit diagram of a modification of a communicating section;

FIG. 13 is a timing chart showing the operation of the communicating section shown in FIG. 12;

DESCRIPTION OF THE PREFERRED EMBODIMENTS

An embodiment of the present invention will be described below with reference to the drawings.

Figure 3:
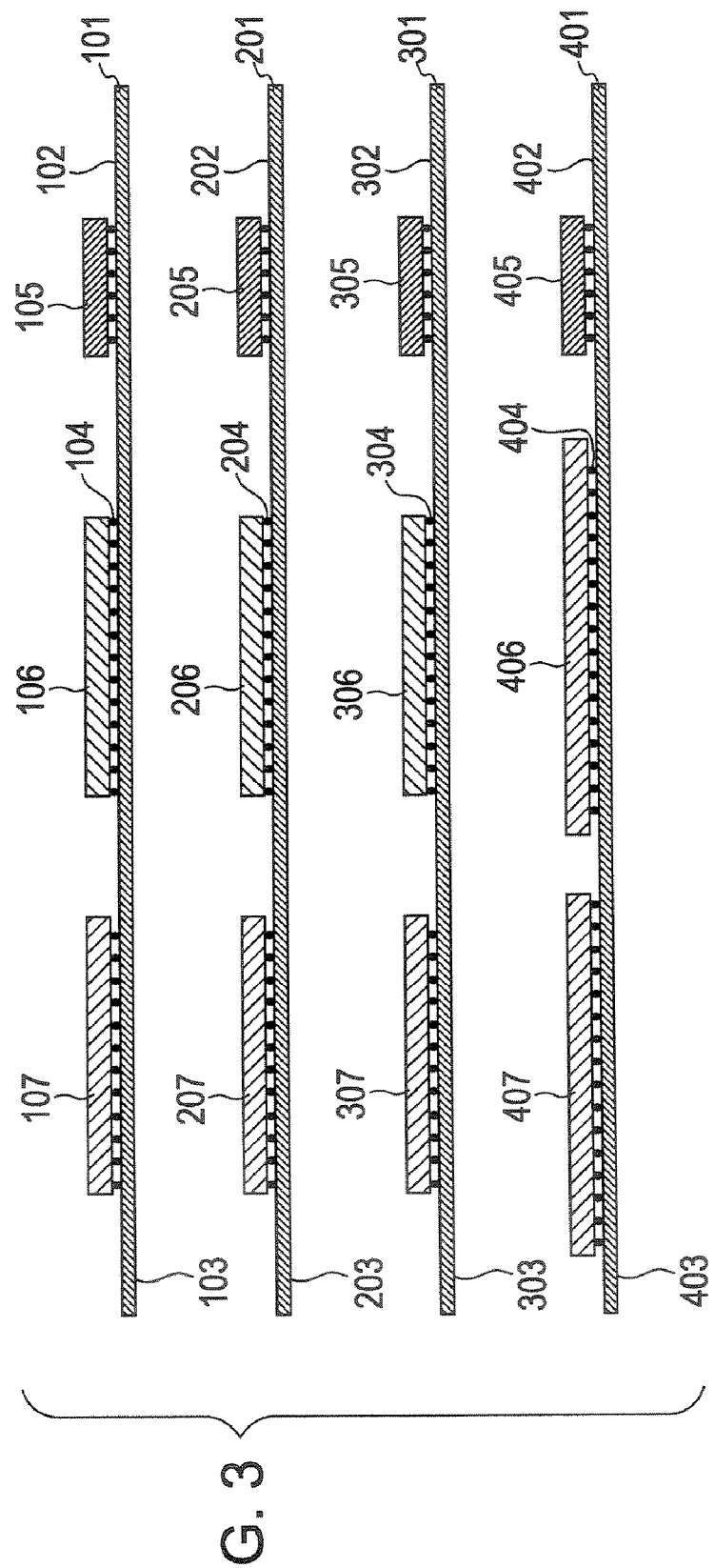
FIG. 3 is a sectional side view showing the structures of silicon interposers in a multichip module to which an embodiment of the present invention is applied.

FIG. 3 shows the structures of silicon interposers serving as plate members that are formed of a high-resistance material and are incorporated in a multichip module to which an embodiment of the present invention is applied. A communication chip 105 and chips 106 and 107 are provided on a first surface 102 of a silicon interposer 101 with a plurality of bumps 104 disposed therebetween. While the communication chip 105 will be described in detail below with reference to FIGS. 6 to 8, it is used for communication with the other silicon interposers. The chips 106 and 107 are, for example, CPUs (Central Processing Units) or memories, and perform processing corresponding to predetermined functions. Although not shown, a wiring pattern is provided on the first surface 102 of the silicon interposer 101. There is no chip on a second surface 103 of the silicon interposer 101.

Similarly, a communication chip 205 and chips 206 and 207 are mounted on a first surface 202 of a silicon interposer 201 with a plurality of bumps 204 disposed therebetween. There is no chip on a second surface 203 of the silicon interposer 201.

A communication chip 305 and chips 306 and 307 are mounted on a first surface 302 of a silicon interposer 301 with a plurality of bumps 304 disposed therebetween. There is no chip on a second surface 303 of the silicon interposer 301.

Similarly, a communication chip 405 and chips 406 and 407 are mounted on a first surface 402 of a silicon interposer 401 with a plurality of bumps 404 disposed therebetween. There is no chip on a second surface 403 of the silicon interposer 401.

The chips 206, 207, 306, 307, 406, and 407 serve predetermined functions other than communication, similarly to the chips 106 and 107.

Figure 4:
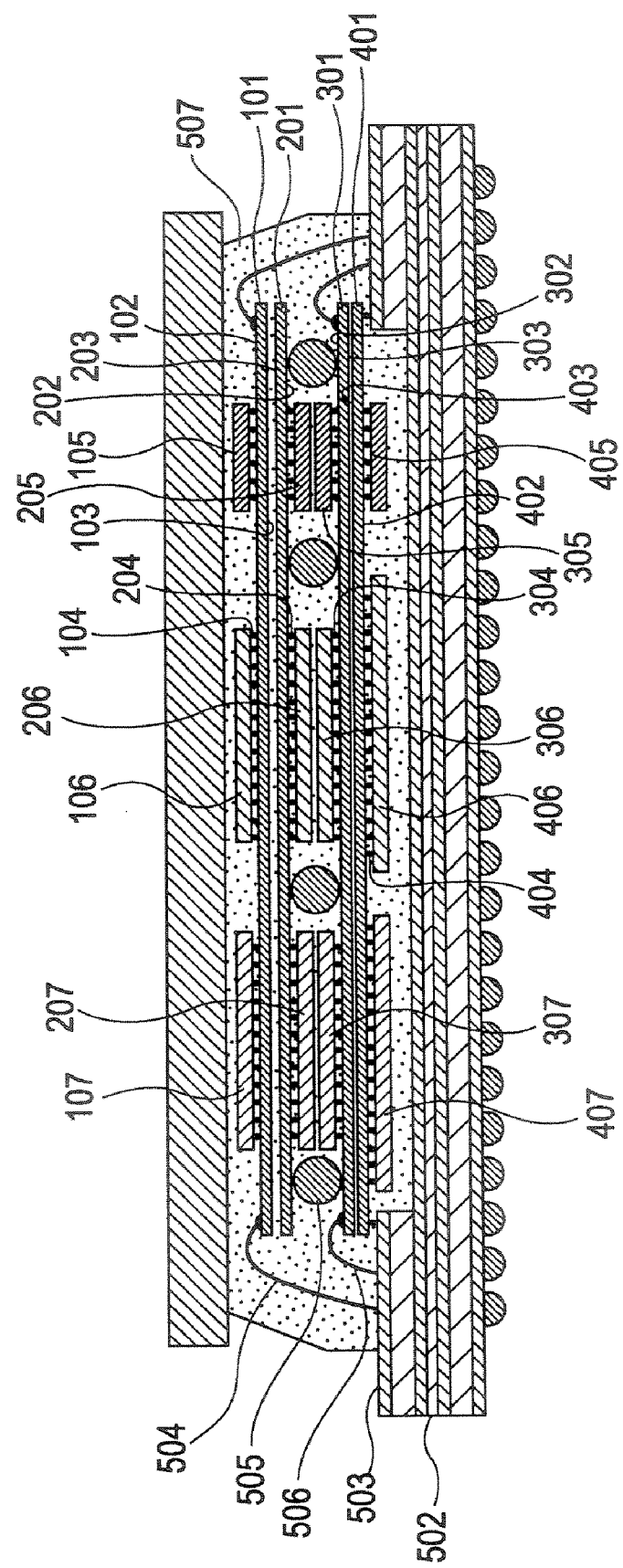
FIG. 4 is a sectional side view of the multichip module.

FIG. 4 shows the configuration of a multichip module 501 produced by combining the silicon interposers 101 to 401. In this multichip module 501, the silicon interposer 101 and the silicon interposer 201 are paired, and the silicon interposer 301 and the silicon interposer 401 are paired.

That is, the silicon interposer 101 and the silicon interposer 201 are arranged so that the second surfaces 103 and 203 thereof face each other and so that flat plates (described below with reference to FIG. 6) serving as antennas of the communication chips 105 and 205 oppose each other. Similarly, the silicon interposer 301 and the silicon interposer 401 are arranged so that the second surfaces 303 and 403 thereof face each other and so that flat plates of the communication chips 305 and 405 oppose each other.

Wiring patterns are provided on a first surface 503 of a substrate 502, and various chips (not shown) are mounted thereon, as required. The first surface 503 is connected to the first surface 302 of the silicon interposer 301 via bonding wires 506. The first surface 102 of the silicon interposer 101 is also connected to the first surface 503 of the substrate 502 via bonding wires 504. The first surface 402 of the silicon interposer 401 is connected to the first surface 503 of the substrate 502 via a plurality of bumps 404. The first surface 302 of the silicon interposer 301 and the first surface 202 of the silicon interposer 201 are connected by a plurality of bumps 505.

In the above-described configuration, necessary power is supplied from the wiring pattern provided on the first surface 503 of the substrate 502 to the communication chip 405 and the chips 406 and 407 provided on the first surface 402 of the silicon interposer 401 via predetermined ones of the bumps 404. Similarly, signals are exchanged between a predetermined pattern provided on the first surface 503 of the substrate 502 and the communication chip 405 and the chips 406 and 407 on the silicon interposer 401 via the other predetermined ones of the bumps 404.

Necessary power is supplied from the wiring pattern on the first surface 503 of the substrate 502 to the communication chip 305 and the chips 306 and 307 on the silicon interposer 301 via the bonding wires 506. The chips 306 and 307 communicate with the chips 406 and 407 on the silicon interposer 401 via the communication chips 305 and 405.

Power is supplied from the wiring pattern on the first surface 503 of the substrate 502 to the communication chip 205 and the chips 206 and 207 on the silicon interposer 201 via the bonding wires 506, the wiring pattern on the silicon interposer 301, the predetermined bumps 505, the wiring pattern on the first surface 202 of the silicon interposer 201, and the predetermined bumps 204. The chips 206 and 207 communicate with the chips 306 and 307 on the silicon interposer 301 via the predetermined bumps 304, the wiring pattern on the silicon interposer 201, the predetermined bumps 505, the wiring pattern on the silicon interposer 301, and the predetermined bumps 304.

Necessary power is supplied from the wiring pattern on the first surface 503 of the substrate 502 to the communication chip 105 and the chips 106 and 107 on the silicon interposer 101 via the bonding wires 504, the wiring pattern on the silicon interposer 101, and the predetermined bumps 104. Communication between the chips 106 and 107 and the chips 206 and 207 is conducted via the communication chips 105 and 205.

Communication between the silicon interposers that are not directly adjacent to each other is achieved by sequentially performing communication between the directly adjacent silicon interposers. For example, communication between the chips 106 and 107 and the chips 306 and 307 is conducted via the communication chip 105, the communication chip 205, and the bumps 505. Further, communication between the chips 106 and 107 and the chips 406 and 407 is conducted via the communication chip 105, the communication chip 205, the bumps 505, the communication chip 305, and the communication chip 405. Communication between the chips 106 and 107 and chips (not shown) on the first surface 503 of the substrate 502 is conducted via the communication chip 105, the communication chip 205, the bumps 505, the communication chip 305, the communication chip 405, and the bumps 404.

Figure 5A:
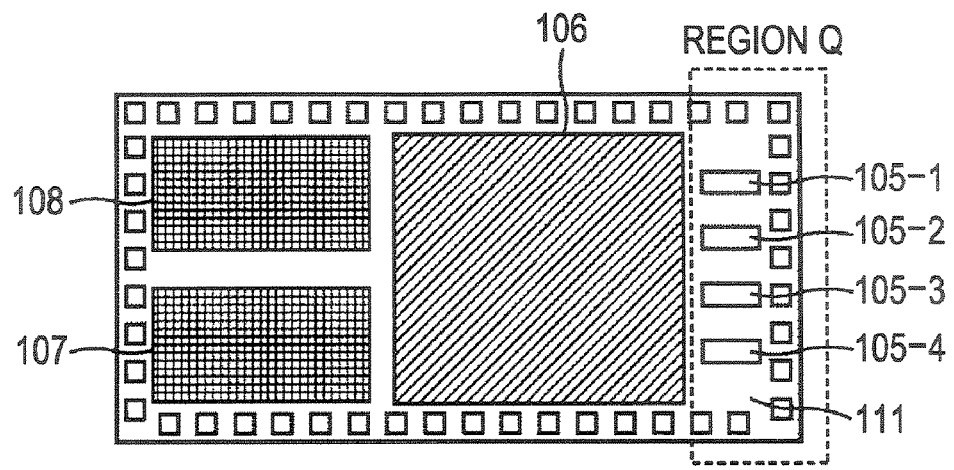
FIGS. 5A and 5B are plan views of the silicon interposers.
Figure 5B:
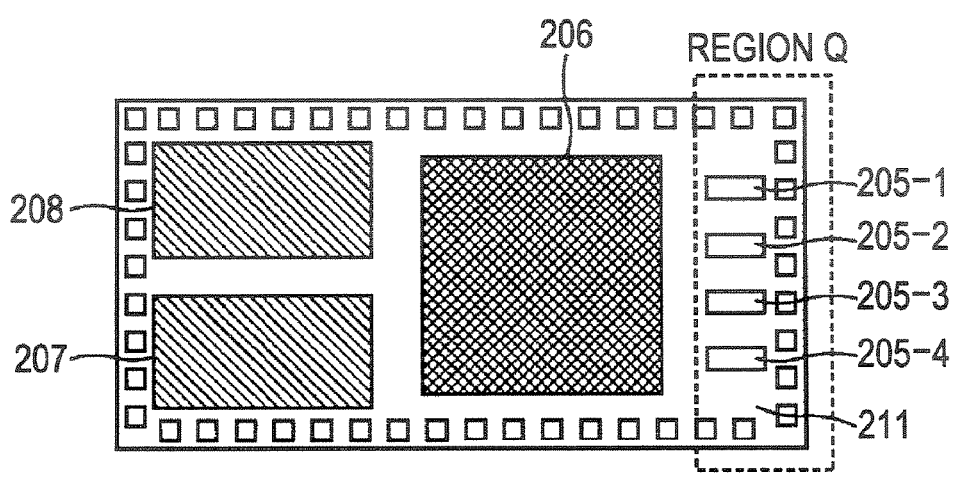

FIGS. 5A and 5B show the planar structures of the silicon interposers 101 and 201. In FIG. 5A, a chip 108 is disposed on the upper left side of the chip 106 and the chip 107 is disposed on the lower left side of the chip 106 in the silicon interposer 101. A communication region 111 is provided in a region Q on the right side of the chip 106. Communication chips 105-1 to 105-4 are provided in the communication region 111.

Similarly, in FIG. 5B, the chip 207 is disposed on the lower left side of the chip 206 and a chip 208 is disposed on the upper left side of the chip 206 in the silicon interposer 201. A communication region 211 is provided in a region Q on the right side of the chip 206. Communication chips 205-1 to 205-4 are provided in the communication region 211.

Although not shown, the silicon interposers 301 and 401 have structures similar to the above.

FIG. 6 is an enlarged view showing the planar structures of the communication chips 105-1 to 105-4. Flat plates 121-1-1 and 122-1-1, each formed of a metal, such as aluminum, are provided on the upper side of the communication chip 105-1. The flat plates 121-1-1 and 122-1-1 are paired for signal transmission or receiving. Similarly, the communication chip 105-1 also includes flat plates 121-1-2 and 122-1-2 to 121-1-8 and 122-1-8 arranged from right to left in order from the flat plates 121-1-1 and 122-1-1. Similarly, flat plates 121-1-9 and 122-1-9 to 121-1-16 and 122-1-16 are arranged from right to left on the lower side of the communication chip 105-1 (the reference numerals of some of the flat plates are not shown).

Similarly, the communication chip 105-2 includes flat plates 121-2-1 and 122-2-1 to 121-2-16 and 122-2-16, the communication chip 105-3 includes flat plates 121-3-1 and 122-3-1 to 121-3-16 and 122-3-16, and the communication chip 105-4 includes flat plates 121-4-1 and 122-4-1 to 121-4-16 and 122-4-16.

FIG. 7 is an enlarged cross-sectional view of the communication chip 105-1. In FIG. 7, the flat plates 121-1 and 121-9 are disposed on the right and left sides of the communication chip 105-1 via bumps 104. The communication chip 105-1 is connected to a pad 131 on the silicon interposer 101 via a bump 104. The pad 131 is also connected to a wiring pattern (not shown).

Figure 1:
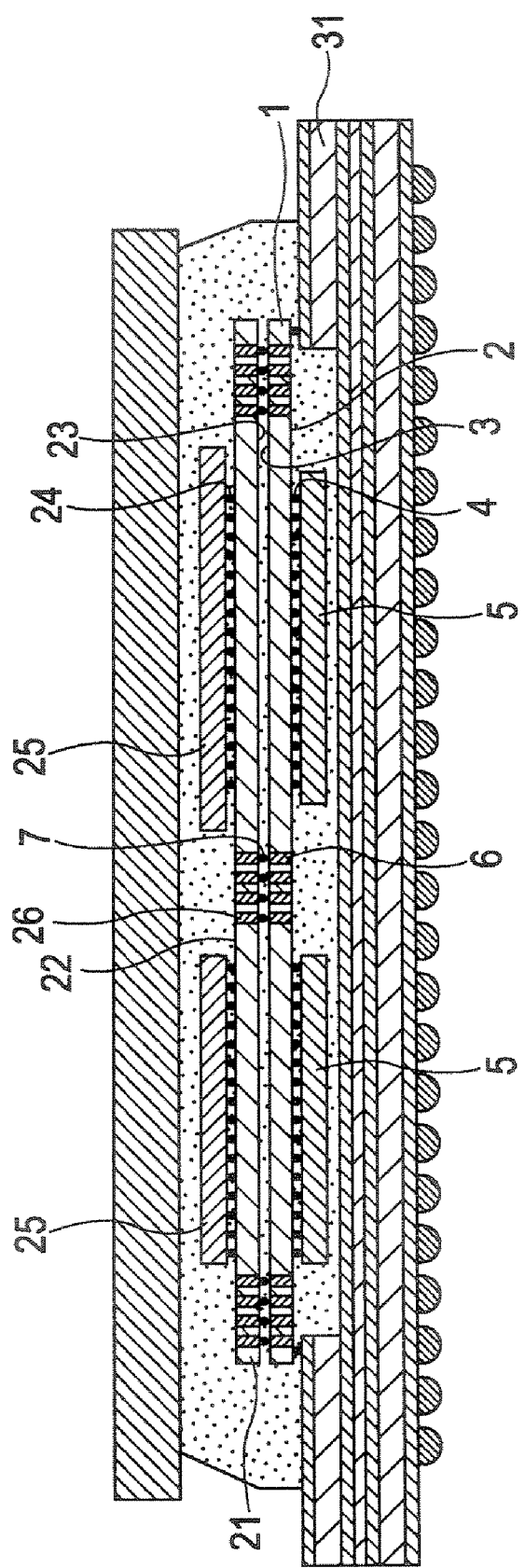
FIG. 1 is a cross-sectional view of a known multichip module.
Figure 2A:
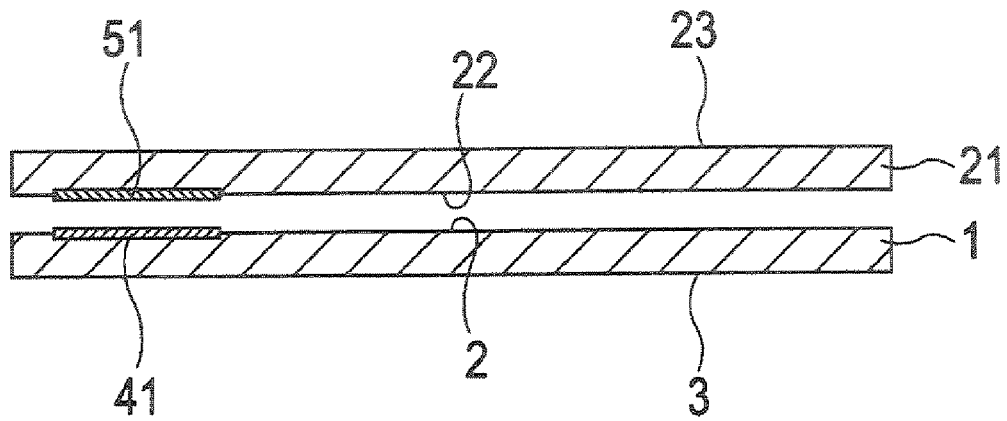
FIGS. 2A and 2B are explanatory views showing communication between silicon interposers in the known multichip module.
Figure 2B:
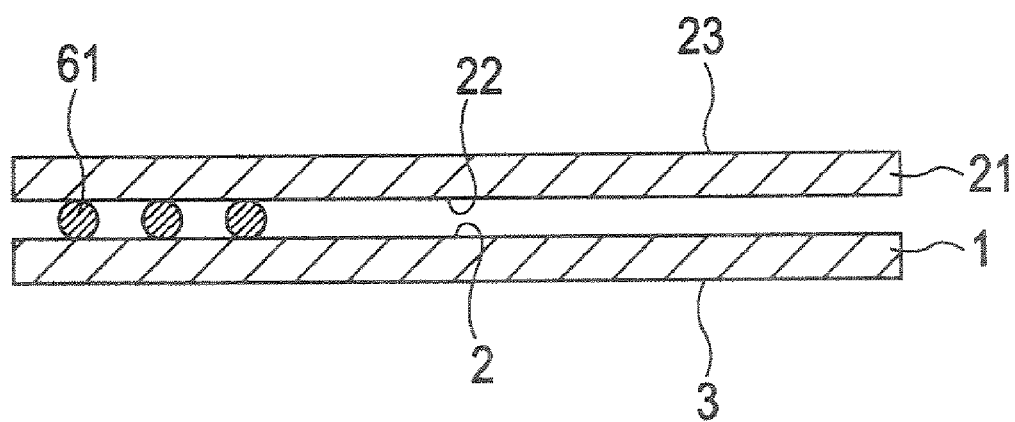

As shown in FIG. 8, the flat plates 121-1 (121-1-1 to 121-1-16) of the silicon interposer 101 are disposed such as to oppose the corresponding flat plates 221-1 (221-1-1 to 221-1-16) of the silicon interposer 201. As a result, the silicon interposers 101 and 201 formed of a high-resistance material are interposed between the opposing flat plates 121-1 and 221-1. Since the silicon interposers 101 and 201 are high-resistance silicon substrates, they have a high dielectric constant. Therefore, the capacity of a capacitor formed by the flat plates 121-1 and 221-1 can be made extremely larger than in the case in which the electrodes 41 and 51 simply face each other with air therebetween, as shown in FIG. 2A. Consequently, even when the areas of the flat plates 121-1 and 221-1 are small, sufficiently large electrostatic coupling can be achieved.

Figure 9:
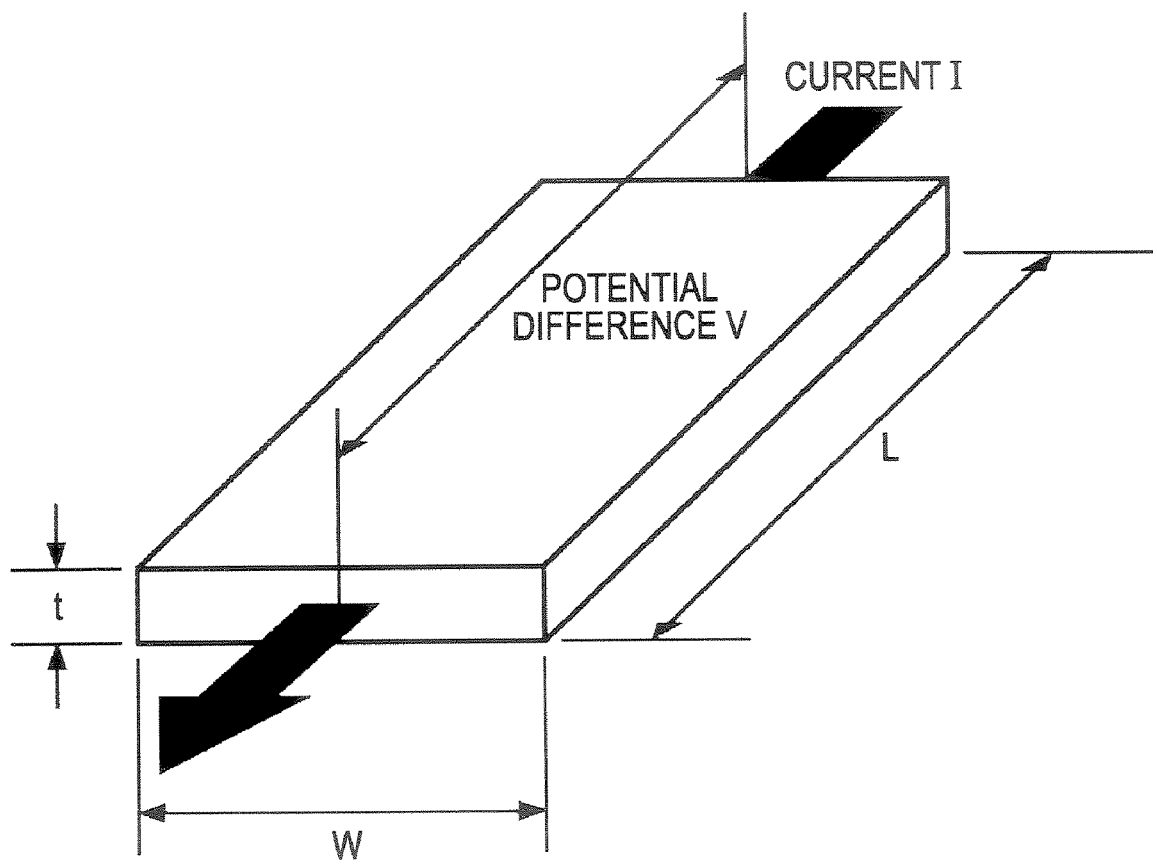
FIG. 9 is an explanatory view of the volume resistivity.

Specifically, the volume resistivity of the silicon interposers 101 to 401 is set to be 1 kΩcm or more. For example, the volume resistivity can be given by the following expression:

$$\text{Volume resistance} = (V/I) \times (W/L) \times t \quad (1)$$

where W represents the width of a material, t represents the thickness of the material, L represents the length of the material, I represents the current to be passed through the material, and V represents the potential difference between both ends of the material, as shown in FIG. 9.

Since silicon is a nonconductive material, high-resistance silicon interposers can be obtained without doping silicon with impurities.

Figure 10:
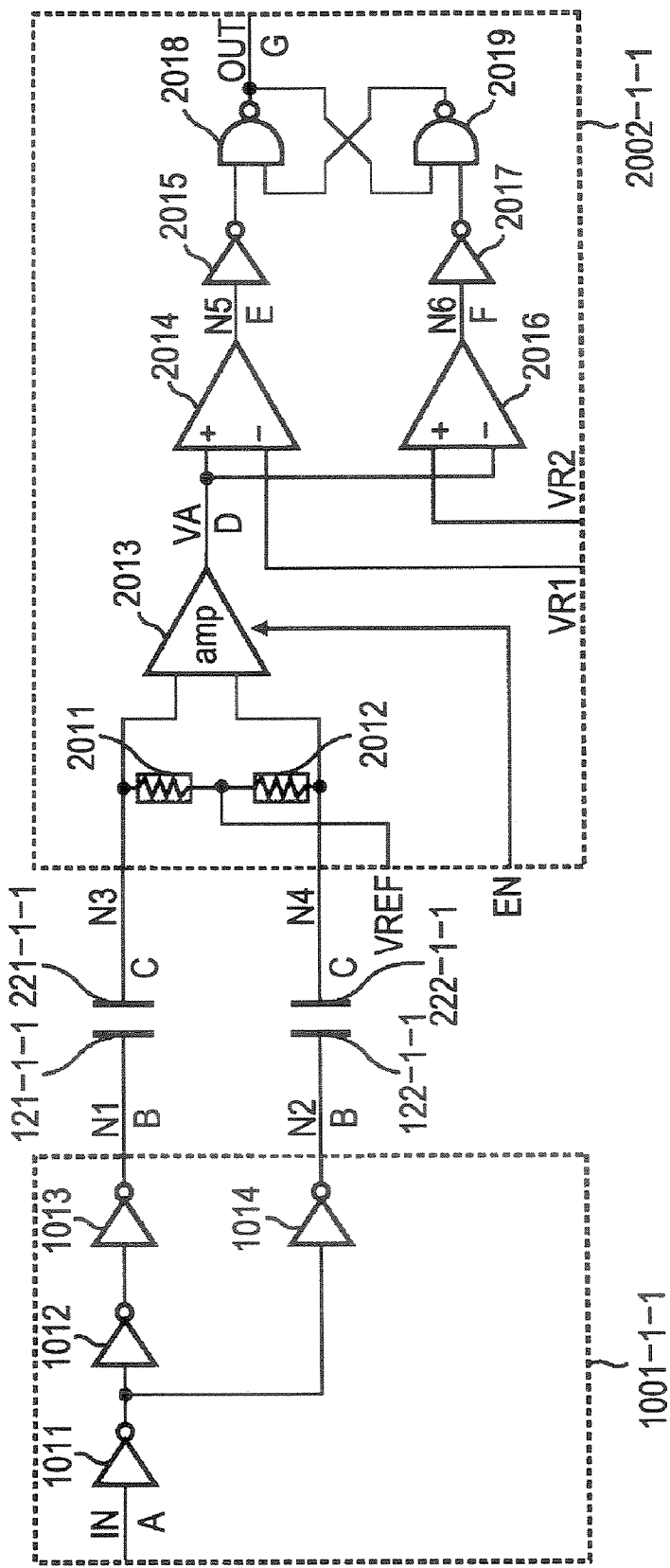
FIG. 10 is a circuit diagram of a communicating section.

Each of the communication chips 105, 205, 305, and 405 includes communicating sections each of which is formed of at least one of a transmitter and a receiver corresponding to the flat plates. That is, a transmitter is provided corresponding to a flat plate for signal transmission, and a receiver is provided corresponding to a flat plate for signal receiving. When the flat plate performs both transmission and receiving, a transmitter and a receiver are provided corresponding to the flat plate. The communication chip 105 and the communication chip 205 are arranged so that the transmitting flat plates oppose the receiving flat plates. For example, when the receiving flat plates 221-1-1 and 222-1-1 oppose the transmitting flat plates 121-1-1 and 122-1-1, a transmitter 1001-1-1 corresponding to the transmitting flat plates 121-1-1 and 122-1-1 is connected to a receivers 2002-1-1 corresponding to the receiving flat plates 221-1-1 and 222-1-1, as shown in FIG. 10.

The transmitter 1001-1-1 includes inverters 1011 to 1014. A signal input from a terminal IN is supplied from a terminal N1 to the flat plate 121-1-1 via the inverters 1011, 1012, and 1013, and is also supplied from a terminal N2 to the flat plate 122-1-1 via the inverters 1011 and 1014.

The flat plates 221-1-1 and 222-1-1 are respectively connected to input terminals N3 and N4 of the receiver 2002-1-1. The input terminals N3 and N4 are connected to input terminals of an amplifier 2013. Resistors 2011 and 2012 are connected between the input terminals N3 and N4, and a reference voltage VREF is supplied between the resistors 2011 and 2012. An output of the amplifier 2013 is supplied to a non-inverting input terminal of a hysteresis comparator 2014 and an inverting input terminal of a hysteresis comparator 2016. A reference voltage VR1 is supplied to an inverting input terminal of the comparator 2014, and a reference voltage VR2 is supplied to a non-inverting input terminal of the comparator 2016.

An output (a node N5) of the comparator 2014 is connected to one input of a NAND circuit 2018, which constitutes a cross latch circuit with a NAND circuit 2019, via an inverter 2015. An output (a node N6) of the comparator 2016 is connected to one input of the NAND circuit 2019 via an inverter 2017. An output of the NAND circuit 2018 is connected to the other input of the NAND circuit 2019, and an output of the NAND circuit 2019 is connected to the other input of the NAND circuit 2018.

When a signal is input to the terminal IN of the transmitter 1001-1-1 (FIG. 11A), a voltage is generated at the terminal N1 (flat plate 121-1-1) via the inverters 1011, 1012, and 1013, and a voltage is generated at the terminal N2 (flat plate 122-1-1) via the inverters 1011 and 1014. These voltages have opposite phases (a voltage shown by a broken line and a voltage shown by a solid line in FIG. 11B). Voltages having opposite phases are generated at the receiving flat plates 221-1-1 and 222-1-1 (input terminals N3 and N4) by electrostatic induction (a voltage shown by a broken line and a voltage shown by a solid line in FIG. 11C). The amplifier 2013 amplifies the signal supplied by the electrostatic induction, and outputs the signal to a node VA (FIG. 11D).

Figure 11:
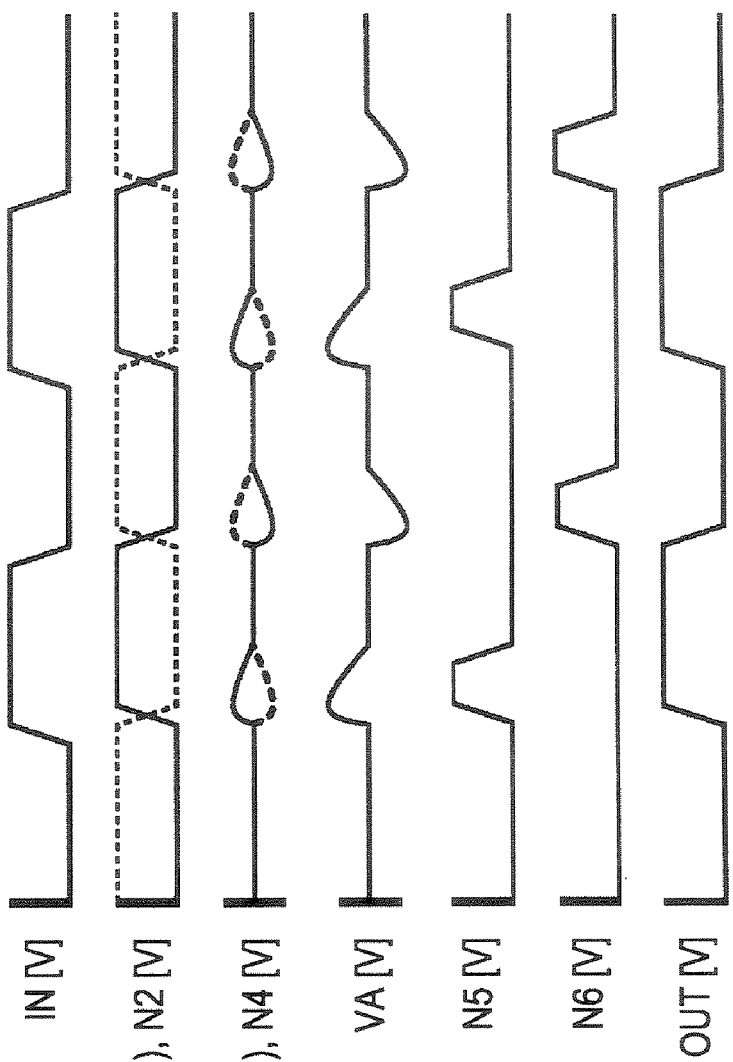
FIG. 11 is a timing chart showing the operation of the communicating section shown in FIG. 10.

The comparator 2014 compares the level of the signal input from the amplifier 2013 with the reference voltage VR1, and outputs a positive pulse to the node N5 when the signal level is higher than the reference voltage VR1 (FIG. 11E). Similarly, the comparator 2016 compares the level of the signal output from the amplifier 2013 with the reference voltage VR2, and outputs a positive pulse to the node N6 when the signal level is lower than the reference voltage VR2 (FIG. 11F). The outputs of the nodes N5 and N6 are respectively inverted by the inverters 2015 and 2017, are latched and output by the cross latch circuit that inverts the output every time a negative pulse is input (FIG. 11G).

While a signal is exchanged between two pairs of flat plates in the above, when a signal of a sufficient level can be obtained, it can be exchanged between one pair of flat plates 121-1-1 and 122-1-1, as shown in FIG. 12. In this case, a transmitter 1001-1-1 includes inverters 1031 and 1032, and a signal input to a terminal IN is supplied to the flat plate 121-1-1 connected to a terminal N1 via the inverters 1031 and 1032.

A receiver 2002-1-1 includes inverters 2031, 2032, and 2033, and a signal from the flat plate 221-1-1 connected to a terminal N2 is output from a terminal OUT via the inverters 2031 and 2032. Further, an output of the inverter 2031 is fed back to the input of the inverter 2031 via the inverter 2032.

When a signal is input to the terminal IN of the transmitter 1001-1-1 (FIG. 13A), a voltage is generated at the terminal N1 (flat plate 121-1-1) via the inverters 1031 and 1032 (FIG. 13B). A voltage is also generated at the receiving flat plate 221-1-1 (input terminal N2) by electrostatic induction (FIG. 13C). The voltage at the terminal N2 exceeds a threshold value Vth of the inverter 2031, the output of the inverter 2031 is inverted, and the output of the inverter 2032 is also inverted, which accelerates the change of the input of the inverter 2031. The output of the inverter 2031 is further inverted by the inverter 2033, and is output from the terminal OUT (FIG. 13D).

While the communication chips 105 to 405, the chips 106 to 406, and the chips 107 to 407 are mounted on the silicon interposers 101 to 401 so as to form the corresponding circuits in the above embodiment, circuits may be directly provided on the silicon interposers 101 to 401.

Figure 14A:
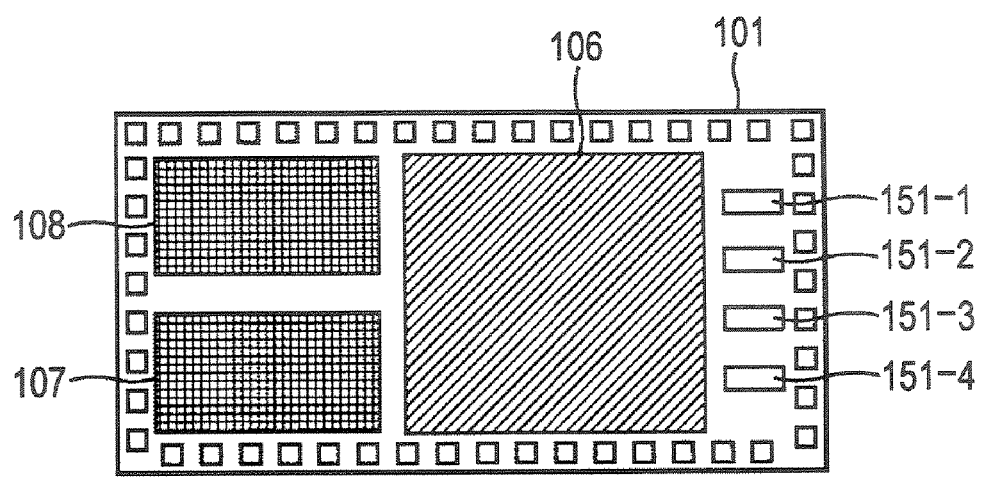
FIGS. 14A and 14B are plan views of silicon interposers according to another embodiment of the present invention.
Figure 14B:
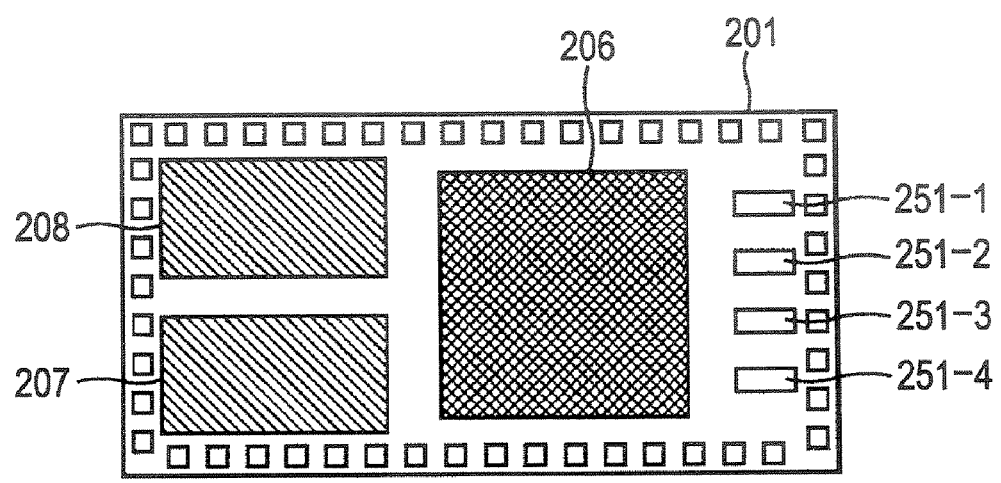

In another embodiment shown in FIG. 14, communication circuits 151-1 to 151-4 are directly provided on a silicon interposer 101. Similarly, communication circuits 251-1 to 251-4 are directly provided on a silicon interposer 201.

Figure 15:
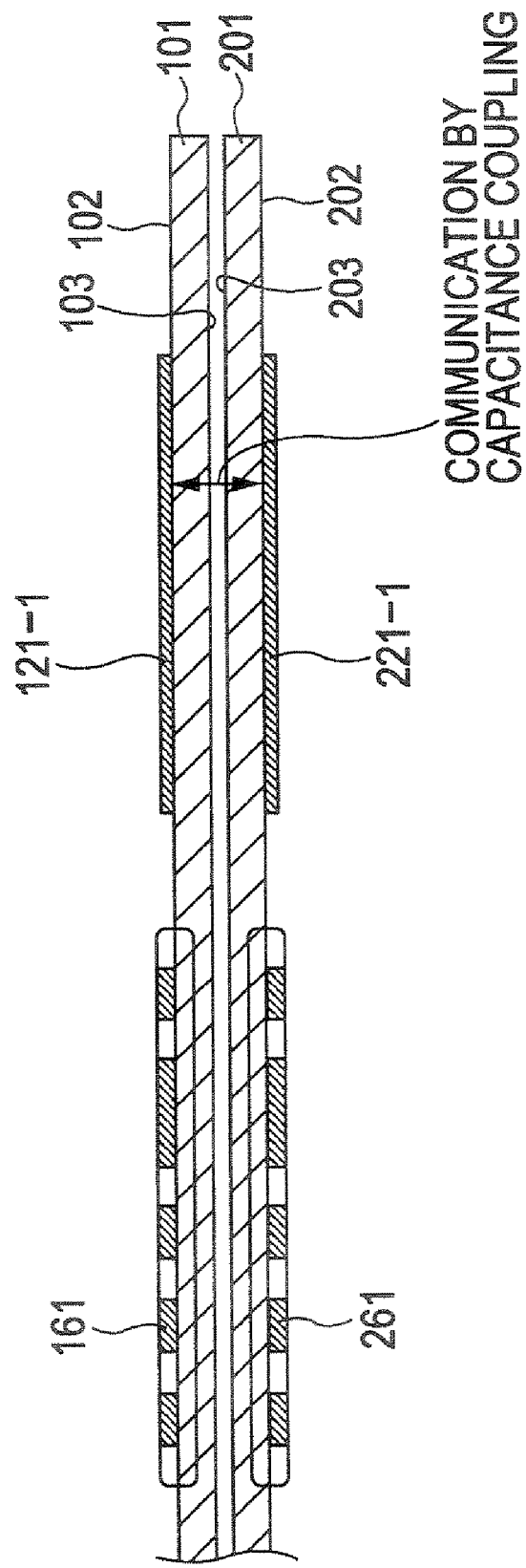
FIG. 15 is a sectional side view showing a state in which the silicon interposers are combined.

In this case, the silicon interposer 101 and the silicon interposer 201 are combined, as shown in FIG. 15. A CMOS (Complementary Mental-Oxide Semiconductor) circuit 161 corresponding to the communication circuits 151-1 to 151-4 is provided on a surface 102 of the silicon interposer 101. A flat plate 121-1 is provided, in a manner similar to that in FIG. 8.

A CMOS circuit 261 corresponding to the communication circuits 251-1 to 251-4 is provided on a surface 202 of the silicon interposer 201. In this case, a flat plate 221-1 is provided on the surface 202 of the silicon interposer 201, in a manner similar to that in FIG. 8.

Therefore, communication can be performed in a manner similar to that in FIG. 8.

Figure 16:
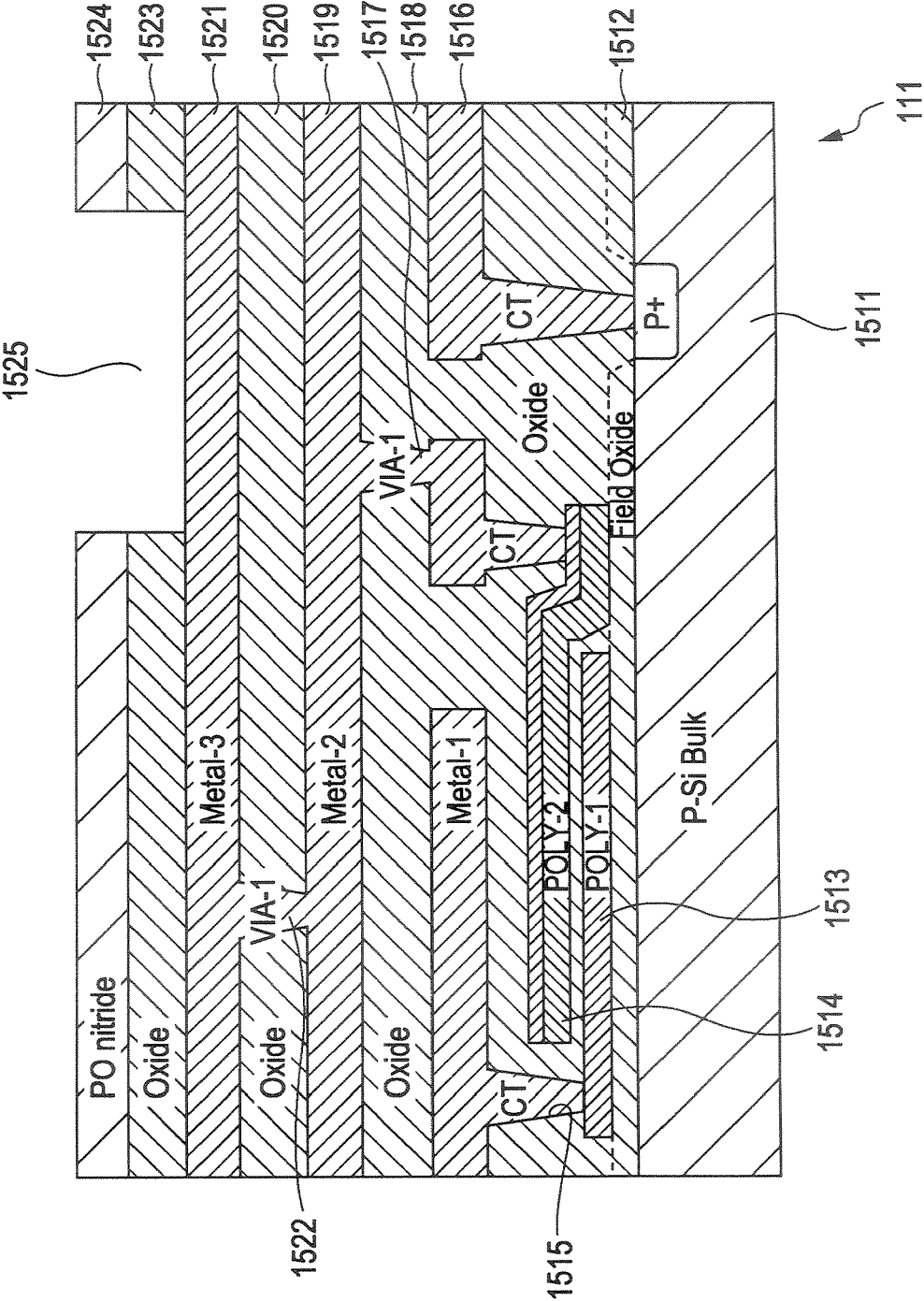
FIG. 16 is a sectional side view showing the internal structure of the silicon interposer.

FIG. 16 shows an example of a cross-sectional structure of the communication region 111 in the silicon interposer (the CMOS structure in the embodiment shown in FIGS. 14 and 15 is not shown). A field oxide film 1512 is provided on a P-type silicon bulk 1511. Polycides 1513 and 1514 are disposed at a predetermined distance from each other on the field oxide film 1512. The capacitance between the polycides 1513 and 1514 is used to stabilize the power supply. The polycide 1513 is connected to a metal layer 1516 by a contact 1515.

The metal layer 1516 and a metal layer 1519 disposed thereon with an oxide film 1518 therebetween are connected by a via 1517. The metal layer 1519 and a metal layer 1521 disposed thereon with an oxide film 1520 therebetween are connected by a via 1522. An oxide film 1523 is provided on the metal layer 1521, and a protective film 1524 is provided on the oxide film 1523. A PAD opening 1525 is provided in the protective film 1524 and the oxide film 1523.

While the present invention is applied to the multichip module in the above-described embodiments, it is also applicable to other semiconductor devices.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a first plate member formed of a high-resistance material, and having a circuit surface on which a circuit is provided;
    a second plate member formed of a high-resistance material, and having a circuit surface on which a circuit is provided;
    a plurality of first flat plates serving as communication antennas, the first flat plates being disposed on the circuit surface of the first plate member;
    a first communicating section for performing communication via the first flat plates, the first communicating section being disposed on the circuit surface of the first plate member;
    a plurality of second flat plates serving as communication antennas, the second flat plates being disposed on the circuit surface of the second plate member; and
    a second communicating section for performing communication via the second flat plates, the second communicating section being disposed on the circuit surface of the second plate member,
    wherein the first plate member and the second plate member are arranged so that a surface of the first plate member opposite to the circuit surface faces a surface of the second plate member opposite to the circuit surface.

2. The semiconductor device according to claim 1, wherein the first plate member has a bonding wire for receiving power, and the second plate member has a bump for receiving power.

3. The semiconductor device according to claim 1, wherein the first plate member and the second plate member are silicon interposers, and have a volume resistivity of 1 kΩcm or more.

4. The semiconductor device according to claim 1, wherein the first plate member and the second plate member include at least two pairs of the first plate members and the second plate members, wherein the circuit surface of one of the first plate member and the second plate member in one of the pairs faces the circuit surface of one of the first plate member and the second plate member in the other pair, and wherein a communication bump and a power supply bump are provided between the circuit surfaces.

* * * * *